April 26, 1960 M. E. JONES 2,934,685

TRANSISTORS AND METHOD OF FABRICATING SAME

Filed Jan. 9, 1957

INVENTOR

Morton E. Jones

BY Stevens, Davis, Miller & Mosher

ATTORNEYS

United States Patent Office 2,934,685

Patented Apr. 26, 1960

2,934,685

TRANSISTORS AND METHOD OF FABRICATING SAME

Morton E. Jones, Dallas, Tex., assignor to Texas Instruments Incorporated, Dallas, Tex., a corporation of Delaware Application January 9, 1957, Serial No. 633,217

16 Claims. (Cl. 317—235)

This invention relates to a method of attaching electrical connections to a semiconductor element to form a transistor, and the transistor that results therefrom. In particular, it relates to a method of attaching electrical connections to a semiconductor wafer, as distinguished from a semiconductor bar, and to a semiconductor wafer which has near one surface at least two thin layers of semiconductor material which form with the main body of the wafer either an n-p-n or p-n-p junction.

Prior to this invention, transistors have been formed from small semiconductor wafers of the order of .1 to .2 inch square by .005 to .010 inch thick, these semiconductor wafers having a pair of layers on one surface, each of the order of .001 to .002 inch in thickness, and forming with the body of the wafer either an n-p-n or p-n-p junction. Such wafers can be either of silicon or of germanium or any other type of semiconductor material. The preferred way of making these transistor wafers has been to selectively diffuse into the surface of the body of the wafer the necessary impurities to convert the layers of material to the desired conductivity.

In order to convert the transistor wafer into a finished transistor, it is necessary to affix electrical connections to the body of the wafer and also to each one of the two junction-forming layers. The manner in which these electrical connections are affixed, particularly those to be affixed to thin layers, is especially important in determining the electrical characteristics of the finished transistor. It is relatively easy to affix an electrical connection to the main body of a transistor wafer, but when it comes to affixing electrical connections to the two thin layers, considerable difficulties are encountered. It is difficult to make contact with the underlayer without also making contact with the overlying layer, and it is quite difficult to get the contacts to the two layers close enough together to avoid adverse effects due to the resistance in the layers themselves.

In accordance with this invention, it has been discovered that very satisfactory connections to these two layers may be made in a quite simple and efficient manner. Briefly, the method of making these connections consists in placing on the surface of the top layer a small ball or sphere of a material adapted, upon heating, to make a fused contact to the surface layer without affecting its conductivity characteristics. Then, either before or after this heating takes place, a coating of a material that will reverse the conductivity type of the surface layer upon intermixing with it is projected upon the surface layer in such a way that the ball or sphere shields the surface layer lying under it from the application of this impurity. This means that the rest of the surface is coated with the impurity, and when the coated surface, with the ball or sphere in place, is heated, the ball or sphere makes a fused contact with the unchanged surface under it, and the surface surrounding this area, but spaced slightly from the point of contact of the ball or sphere, has its conductivity type changed to match that of the next underlying layer. The result is an n-p or p-n junction, the top layer of which is connected to the ball and which is surrounded by material connected to the underlayer, and of the conductivity type of the underlying layer. This surrounding area is spaced a very small distance from the junction and it forms a satisfactory area to which a contact for the underlayer may be affixed, usually in the form of a fine wire circling the junction and as close to it as it can conveniently be placed.

Further details and advantages of this invention will be apparent from the attached drawings illustrative of the preferred embodiment thereof and from the following detailed description thereof.

Figure 1:
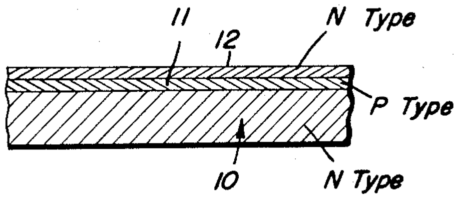
Figure 1 is a cross-section taken through a part of a silicon wafer prepared in accordance with this invention.
Figure 2:
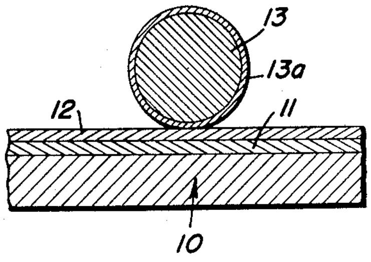
Figure 2 is a similar cross-section but illustrating the first step in the process of forming contacts in accordance with this invention.

As illustrated in Figure 1, the principles of this invention are to be applied to a silicon wafer about .01 inch square by about .005 inch thick and of n-type conductivity. This wafer has been treated so as to form a layer of p-type conductivity 11 near one surface thereof and a layer of n-type conductivity 12 overlying the first layer 11. These layers are of the order of .001 inch thick and can be formed in any desired manner. Preferably, they are formed by starting with an n-type wafer and first diffusing a thin coating of aluminum into the surface to convert the wafer to p-type to a depth of approximately .002 inch; thereafter removing any residual aluminum on the surface and then diffusing a thin coating of antimony into the surface to reconvert the wafer to n-type to the distance of about .001 inch. The residual antimony is then removed and the result is an n-p-n junction formed by the three layers of semiconductor material.

The first step in the process of attaching connections to the prepared transistor wafer consists in placing a small ball or sphere 13 on the surface of the wafer 10. This ball or sphere is preferably of the order of .005 inch in diameter and is made from some inert material, such as tungsten or molybdenum, which will not alloy with the semiconductor material at temperatures of around 600° C. to 800° C. This sphere is wholly or partially coated with a thin layer **13*a* of gold containing a small amount of antimony. Such a coating is conveniently applied by vacuum evaporation and should be only about .001 to .002 inch in thickness. The silicon wafer, with the ball 13** in place, may be immediately heated to a temperature sufficient so that the layer of gold alloys with the surface of the silicon wafer, or the heating may be postponed until after the next step in the process. However, by heating immediately, the difficulty of maintaining the sphere or ball in position during subsequent steps in the process is eliminated.

Figure 3:
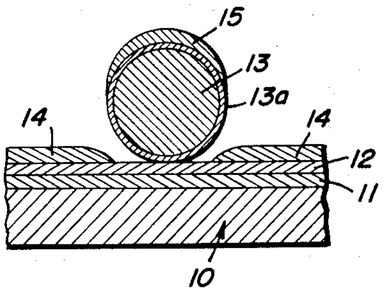
Figure 3 is a similar cross-section illustrating the second step.

The wafer with the ball on it is next placed in a vacuum evaporator and a coating of aluminum is plated onto the ball and surface of the semiconductor body 10. Either a very small source of aluminum is used or a mask with a small hole is placed between the aluminum and the surface to be plated, and this causes the plating to be applied as indicated at 14 and 15 in Figure 3. If the aluminum is derived from a large source and no mask is used, the tendency would be for the aluminum plating to extend under the ball 13. The aluminum is preferably plated to a thickness of approximately 10,000 angstrom units, and the sphere acts as a mask, as shown in Figure 3, to prevent the coating from extending to the point where the ball rests upon the upper layer.

Figure 4:
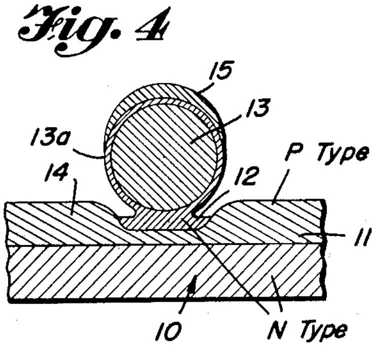
Figure 4 is a similar cross-section illustrating the third step.

After the coating has taken place, the assembly is heated to a temperature of around 600° C. for a sufficient length of time to cause the aluminum of the coating to penetrate the upper layer in the places where it overlies the upper layer and cause this upper layer to be converted to p-type conductivity. If it has not previously been heated to fuse the ball to the upper layer of the wafer, this heating will also accomplish that. The result appears in Figure 4.

Figure 5:
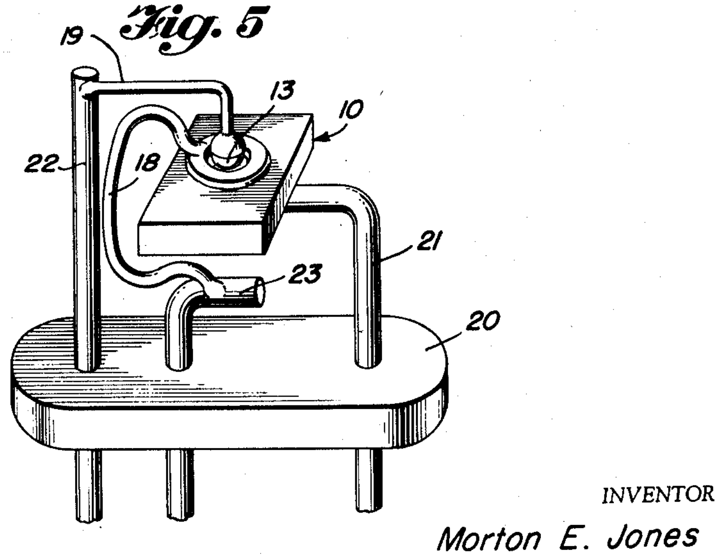
Figure 5 is a perspective view of the wafer and contacts as finally assembled into a transistor, but without a cover or cap thereon.

The next step generally consists in etching away the unnecessary and undesirable surface layers of material. This is accomplished in the conventional way by masking the part that it is not desired to etch, i.e., the ball and the adjacent wafer surface over an area large enough to accommodate the base contact to be attached subsequently, and then applying any desired etching solution. Thereafter, the masking material is removed and, as shown in Figure 5, a base contact 18 is attached to the base layer, which is the portion of the p-type conductivity layer remaining after etching. This contact extends around the ball or sphere 13 and is preferably positioned quite close to it. An emitter contact 19 is attached to the sphere 13. The assembly is supported from a base 20, through which a member 21 extends both to support and make electrical contact to the main body of the semiconductor wafer 10. This contact is the collector contact. There is then another member 22 that extends through the base 20, and to this the emitter connection 19 is affixed. Still a third member 23, extending through the base 20, is connected to the base contact 18.

It will at once be apparent that the principles of this invention may be applied to either silicon or germanium transistors of the wafer type, and it may also be applied to transistors of this type made from other semiconductors. The principles may be applied to p-n-p type transistors as well as n-p-n type, and the impurity elements utilized will be appropriate to the type of transistor being made. Thus, in a p-n-p type transistor, instead of using gold-antimony as the coating on the sphere 13, this may be gold-aluminum or gold-indium. In the p-n-p type transistor, instead of evaporating aluminum on the surface of the wafer after the ball is in place, antimony or arsenic may be evaporated onto the surface.

The base contact is usually made by placing a fine aluminum wire about .002 inch in diameter upon the aluminum layer and around the ball and alloying it into the layer when the evaporated layer is alloyed into the top layer of the silicon layer. A platinum wire may be used instead when a p-n-p type transistor is to be made and attached by a solder containing an n-type impurity. Further the base contact may be attached to the wafer before the steps of masking and etching to remove excess surface material.

Temperatures and dimensions given have been by way of illustration and not limitation, for it will be obvious that these may be varied greatly without changing the principles involved.

The method of this invention has been found far easier to apply in mass production than those previously known, and results in a transistor having considerably lower base resistance, thus giving superior frequency characteristics. Furthermore, the entire emitter, instead of only a part of it, is active, thus further improving the final transistor.

What is claimed is:

1. A method of fabricating transistors that comprises preparing a wafer of semiconductor material of one conductivity type so that it has two superimposed layers of semiconductor material on one surface forming with the body of the wafer a double electrical junction, said layers being of the order of .001 to .002 inch in thickness and the surface layer being of said one conductivity type and the intermediate layer being of a conductivity type opposite said one conductivity type, placing upon said one surface a ball, the surface of which will alloy with the surface layer of said wafer without changing the conductivity type thereof, projecting a coating of a material onto the ball and said one surface of the wafer in such a manner that the ball masks the said one surface of the wafer at the point of contact therebetween together with a small surrounding area, said projected material being one that will change the conductivity type of the surface layer of the wafer when alloyed therewith, heating the assembly to cause the coating on the ball to alloy with the surface layer of the wafer at the point of contact therebetween and to cause the projected coating material to alloy with the surface layer underlying it and attaching electrical leads to the ball, the changed surface layer, and the body of the wafer.

2. A method of fabricating transistors as defined in claim 1 in which the body of the transistor is of n-type silicon, the surface layer is of n-type silicon and the intermediate layer is of p-type silicon.

3. A method of fabricating transistors as defined in claim 1 in which the heating is performed in two separate steps, the first step occurring before the application of the projected material to the surface layer of the wafer for the purpose of alloying the surface of the ball to the surface of the layer at the point of contact, and the second step occurring after the application of the projected material to the surface layer for the purpose of alloying the projected material to the surface layer underlying it.

4. A method of fabricating transistors that comprises preparing a wafer of semiconductor material of one conductivity type so that it has two superimposed layers of semiconductor material on one surface forming with the body of the wafer a double electrical junction, said layers being of the order of .001 to .002 inch in thickness and the surface layer being of said one conductivity type and the intermediate layer being of a conductivity type opposite said one conductivity type, placing upon said one surface a ball of material inert to said semiconductor material, said ball being of the order of .005 inch in diameter and coated with a material that will alloy with the surface layer of the wafer without changing the conductivity type thereof, projecting a coating of a material onto the ball and said one surface of the wafer in such a manner that the ball masks the said one surface of the wafer at the point of contact therebetween together with a small surrounding area, said projected material being one that will change the conductivity type of the surface layer of the wafer when alloyed therewith, heating the assembly to cause the coating on the ball to alloy with the surface layer of the wafer at the point of contact therebetween and to cause the projected coating material to alloy with the surface layer underlying it and attaching electrical leads to the ball, the changed surface layer, and the body of the wafer.

5. A method of fabricating transistors as defined in claim 4 in which the surface layer of the original wafer is of n-type conductivity, the underlying layer is of p-type conductivity and the body of the wafer is of n-type conductivity.

6. A method of fabricating transistors as defined in claim 4 in which the body of the wafer is of n-type silicon, the surface layer is of n-type silicon, the intermediate layer is of p-type silicon, the ball is of inert material coated with gold containing a small amount of antimony, and the coating material is of aluminum.

7. A method of fabricating transistors that comprise preparing a wafer of n-type silicon so that it has two superimposed layers of semiconductor material on one surface forming with the body of the wafer a double electrical junction, said layers being of the order of .001 to .002 inch in thickness and the surface layer being of n-type conductivity and the intermediate layer being of p-type conductivity, placing upon the surface a ball of inert material of the order of .005 inch in diameter coated with a thin layer of gold containing a small amount of antimony, heating the wafer and ball to cause the coating on the ball to fuse with the surface layer of the wafer, projecting a coating of aluminum of the order of 10,000 angstrom units of thickness onto said ball and surface by vacuum-plating, in such a manner that the ball masks not only the surface at the point of contact but also a small surrounding area, heating the assembly sufficiently to cause the aluminum to intermix with the surface layer and convert it to p-type conductivity, and attaching electrical leads to the ball, the changed surface layer and the body of the wafer.

8. A method of fabricating transistors that comprises preparing a wafer of semiconductor material of one conductivity type so that it has two superimposed layers of semiconductor material on one surface forming with the body of the wafer a double electrical junction, said layers being of the order of .001 to .002 inch in thickness and the surface layer being of said one conductivity type and the intermediate layer being of a conductivity type opposite said one conductivity type, placing upon said one surface a ball, the surface of which will alloy with the surface layer of said wafer without changing the conductivity type thereof, projecting a coating of a material onto the ball and said one surface of the wafer in such a manner that the ball masks the said one surface of the wafer at the point of contact therebetween together with a small surrounding area, said projected material being one that will change the conductivity type of the surface layer of the wafer when alloyed therewith, heating the assembly to cause the coating on the ball to alloy with the surface layer of the wafer at the point of contact therebetween and to cause the projected coating material to alloy with the surface layer underlying it.

9. A method of fabricating transistors that comprises preparing a wafer of semiconductor material of one conductivity type so that it has two superimposed layers of semiconductor material on one surface forming with the body of the wafer a double electrical junction, said layers being of the order of .001 to .002 inch in thickness and the surface layer being of said one conductivity type and the intermediate layer being of a conductivity type opposite said one conductivity type, placing upon said one surface a ball of material inert to said semiconductor material, said ball being of the order of .005 inch in diameter and coated with a material that will alloy with the surface layer of the wafer without changing the conductivity type thereof, projecting a coating of a material onto the ball and said one surface of the wafer in such a manner that the ball masks the said one surface of the wafer at the point of contact therebetween together with a small surrounding area, said projected material being one that will change the conductivity type of the surface layer of the wafer when alloyed therewith, heating the assembly to cause the coating on the ball to alloy with the surface layer of the wafer at the point of contact therebetween and to cause the projected coating material to alloy with the surface layer underlying it.

10. A method of fabricating transistors that comprises preparing a wafer of n-type silicon so that it has two superimposed layers of semiconductor material on one surface forming with the body of the wafer a double electrical junction, said layers being of the order of .001 to .002 inch in thickness and the surface layer being of n-type conductivity and the intermediate layer being of p-type conductivity, placing upon the surface a ball of inert material of the order of .005 inch in diameter coated with a thin layer of gold containing a small amount of antimony, heating the wafer and ball to cause the coating on the ball to fuse with the surface layer of the wafer, projecting a coating of aluminum of the order of 10,000 angstrom units of thickness onto said ball and surface by vacuum-plating, in such a manner that the ball masks not only the surface at the point of contact but also a small surrounding area, heating the assembly sufficiently to cause the aluminum to intermix with the surface layer and convert it to p-type conductivity.

11. A transistor comprising a wafer of semiconductor material of one conductivity type having therein near one surface a diffused layer of opposite conductivity type and an alloyed surface layer of said opposite conductivity type overlying said diffused layer except for a small area, a diffused surface layer of said one conductivity type adjacent said diffused area of opposite conductivity type and within said small area, a ball of material of approximately the same diameter as said small area in contact with said diffused surface layer of one conductivity type, the surface of said ball being of a material producing said one type conductivity when alloyed with semiconductor material and the surface of said ball being alloyed to said diffused layer of one conductivity type at the point of contact therebetween.

12. A transistor comprising a wafer of semiconductor material of one conductivity type having therein near one surface a diffused layer of opposite conductivity type and an alloyed surface layer of said opposite conductivity type overlying said diffused layer except for a small area, a diffused surface layer of said one conductivity type adjacent said diffused layer of opposite conductivity type and within said small area, a ball of inert material coated with a material producing said one type conductivity when alloyed with semiconductor material in contact with said diffused surface layer of said one conductivity type, said ball being about the same diameter as said small area and the surface of said ball being alloyed to said diffused layer of one conductivity type at the point of contact therebetween.

13. A transistor comprising a wafer of n-type conductivity having therein near one surface a diffused layer of p-type conductivity and an alloyed surface layer of p-type conductivity overlying said diffused layer except for a small area, a diffused surface layer of n-type conductivity adjacent said diffused layer of p-type conductivity and within said small area, a ball of inert material coated with an n-type conductivity producing material in contact with said diffused surface layer of n-type conductivity, said coating being alloyed to said diffused layer of n-type conductivity at the point of contact therebetween.

14. A transistor comprising an n-type conductivity silicon wafer having therein near one surface a p-type conductivity diffused layer and an alloyed surface layer of p-type conductivity overlying said diffused layer except for a small area, a diffused surface layer of n-type conductivity adjacent said diffused layer of p-type conductivity and within said small area, a ball of inert material coated with a thin layer of gold containing a small amount of antimony, said ball being approximately of the same diameter as said small area and being in contact with said n-type diffused layer and said coating of gold with a small amount of antimony being alloyed to said n-type conductivity diffused layer at the point of contact therebetween.

15. A transistor as defined in claim 14 wherein said alloyed surface layer of p-type conductivity contains aluminum.

16. A transistor as defined in claim 15 having electrical connections to said n-type conductivity silicon wafer, said alloyed surface layer of p-type conductivity and to said ball of inert material.

No references cited.